US012431188B2

United States Patent
Emmert

(10) Patent No.: US 12,431,188 B2
(45) Date of Patent: Sep. 30, 2025

(54) EFFICIENT Muller C-Element IMPLEMENTATION FOR HIGH BIT-WIDTH ASYNCHRONOUS APPLICATIONS

(71) Applicant: University of Cincinnati, Cincinnati, OH (US)

(72) Inventor: John Martin Emmert, Dayton, OH (US)

(73) Assignee: University of Cincinnati, Cincinnati, OH (US)

( * ) Notice: Subject to any disclaimer, the term of this patent is extended or adjusted under 35 U.S.C. 154(b) by 195 days.

(21) Appl. No.: 18/265,593

(22) PCT Filed: Dec. 7, 2021

(86) PCT No.: PCT/US2021/062197
§ 371 (c)(1),
(2) Date: Jun. 6, 2023

(87) PCT Pub. No.: WO2022/125542
PCT Pub. Date: Jun. 16, 2022

(65) Prior Publication Data
US 2024/0029780 A1   Jan. 25, 2024

Related U.S. Application Data

(60) Provisional application No. 63/122,073, filed on Dec. 7, 2020.

(51) Int. Cl.
*G11C 11/4076* (2006.01)
*G11C 11/4091* (2006.01)
*G11C 11/4096* (2006.01)

(52) U.S. Cl.
CPC ...... *G11C 11/4076* (2013.01); *G11C 11/4091* (2013.01); *G11C 11/4096* (2013.01)

(58) Field of Classification Search
CPC ............ G11C 11/4076; G11C 11/4091; G11C 11/4096; H03K 19/0185; H03K 19/23; H03K 19/017
See application file for complete search history.

(56) References Cited

U.S. PATENT DOCUMENTS 6,281,707 B1 * 8/2001 Fairbanks ............... H03K 19/20
   712/E9.063
6,900,658 B1 * 5/2005 Sobelman ............. G06F 7/5052
   326/35

(Continued)

OTHER PUBLICATIONS

Vandewerker, Sara A., "Efficient Muller C-Element Implementation for Null Convention Logic Asynchronous Register Feedback Circuit" published online, University of Cincinnati Master of Science Thesis, pp. 1-73, Mar. 12, 2021 (Mar. 12, 2021).

(Continued)

*Primary Examiner* — Daniel D Chang
(74) *Attorney, Agent, or Firm* — Dinsmore & Shohl LLP

(57) ABSTRACT

A system comprises an nMOS active resistor, nMOS transistors, a pMOS active resistor, and pMOS transistors, wherein a subset of the nMOS transistors a subset of the pMOS transistors are coupled to each other, respectively, according to a parallel OR configuration, a source terminal of the nMOS active resistor is coupled to respective drain terminals of the nMOS transistors, and a source terminal of the pMOS active resistor is coupled to respective drain terminals of the pMOS transistors. The transistor level delay based circuit further includes a write subcircuit component includes one of the nMOS transistors coupled to at least one of the pMOS transistors, wherein the write subcircuit is controlled by reverse logic signals, and a gate component includes an additional subset of the plurality of nMOS transistors coupled to an additional subset of the pMOS (Continued)

transistors, the gate component corresponding to a semi-static cross coupled inverter circuit.

20 Claims, 15 Drawing Sheets

(56) References Cited

U.S. PATENT DOCUMENTS

2004/0099913 A1   5/2004   Fulkerson
2006/0033523 A1   2/2006   Erstad et al.

OTHER PUBLICATIONS

EP Extended European Search Report dated Nov. 5, 2024 pertaining to EP application No. 21904244.7 filed Jul. 3, 2023, pp. 1-8.
Smith, S. "Design of an FPGA Logic Element for Implementing Asynchronous NULL Convention Logic Circuits" IEEE Transactions on Very Large Scale Integration (VLSI) Systems, Jun. 2007, pp. 672-683, vol. 15, No. 6, DOI: 10.1109/TVLSI.2007.898726.
Moreira, M., et al. "A New CMOS Topology for Low Voltage Null Convention Logic Gates Design" 2014 20th IEEE International Symposium on Asynchronous Circuits and Systems, 2014, pp. 93-100, DOI: 10.1109/ASYNC.2014.20.

* cited by examiner

EFFICIENT Muller C-Element IMPLEMENTATION FOR HIGH BIT-WIDTH ASYNCHRONOUS APPLICATIONS

CROSS-REFERENCE TO RELATED APPLICATION APPLICATIONS

This application is a § 371 National Stage Application of International Application Serial No. PCT/US2021/062197, filed on Dec. 7, 2021, and claims priority to U.S. Application Ser. No. 63/122,073, filed on Dec. 7, 2020, the entire disclosures of which are hereby incorporated by reference.

STATEMENT REGARDING FEDERALLY SPONSORED RESEARCH AND DEVELOPMENT

This invention was made with Government support under CNS-1916722 awarded by the National Science Foundation. The Government has certain rights in the invention.

TECHNICAL FIELD

The embodiments described herein generally relate to systems suitable for digital asynchronous applications, and more particularly, to systems that include Muller C-Element like null convention logic based applications having high input bit-widths.

BACKGROUND

Synchronous circuits or clocked integrated circuits are susceptible to side channel attacks (SCA). For example, trojan circuits may be included as part of untrustworthy foundries and as part of various applications such as, e.g., electromagnetic emanation, temperature variation, operational characteristics, or as part of a manufacturing process, in order to compromise the operation of the synchronous circuits and facilitate theft of confidential information. Extra hardware included as part of the design and fabrication process of synchronous circuits, to compromise and extract information, decipher secret keys, and so forth, from synchronous circuits, e.g., during heat spikes or increases at the rising or falling clock edge during operation of clocked integrated circuits. Trojan circuits can harvest power and heat dissipated during the rising and falling of a clock edge to decipher secret information. Techniques of addressing and overcoming SCAs may include the use of clockless asynchronous digital designs, such as speed independent circuits and delay independent circuits. However, each of these circuits have limitations. In particular, these circuits fail to completely remove the clocks and are space inefficient.

Accordingly, a need exists for asynchronous null convention logic based systems that are compactly designed and configured to address and overcome the adverse effects of various trojan circuits as described above.

SUMMARY

In one embodiment, a system suitable for null convention logic (NCL) based applications that benefits from fast switching and having large input bit-widths is provided. The system comprises a two-transistor level delay based circuit including an nMOS active resistor and a plurality of nMOS transistors and a pMOS active resistor and a plurality of pMOS transistors, at least a subset of the plurality of nMOS transistors are coupled according to a parallel OR configuration and at least a subset of the plurality of pMOS transistors are coupled according to the parallel OR configuration, a source terminal of the nMOS active resistor is coupled to respective drain terminals of the plurality of nMOS transistors, a source terminal of the pMOS active resistor is coupled to respective drain terminals of the plurality of pMOS transistors, a write sub-circuit component includes at least one of the plurality of nMOS transistors coupled to at least one of the plurality of pMOS transistors, wherein the write sub-circuit is controlled by reverse logic signals, and a gate component includes an additional subset of the plurality of nMOS transistors coupled to an additional subset of the plurality of pMOS transistors, the gate component corresponding to a semi-static cross-coupled inverter circuit.

In another embodiment, another system suitable for null convention logic based applications having high input bit-widths is provided. The system comprises a two-transistor level delay based circuit including an nMOS active resistor and a plurality of nMOS transistors and a pMOS active resistor and a plurality of pMOS transistors, the two-transistor level delay based circuit has a fixed delay value that is independent of an input bit-width, wherein at least a subset of the plurality of nMOS transistors are coupled according to a parallel OR configuration and at least a subset of the plurality of pMOS transistors are coupled according to the parallel OR configuration, a source terminal of the nMOS active resistor is coupled to respective drain terminals of the plurality of nMOS transistors, a source terminal of the pMOS active resistor is coupled to respective drain terminals of the plurality of pMOS transistors, a write sub-circuit component includes at least one of the plurality of nMOS transistors coupled to at least one of the plurality of pMOS transistors, wherein the write sub-circuit is controlled by reverse logic signals, and a gate component includes an additional subset of the plurality of nMOS transistors coupled to an additional subset of the plurality of pMOS transistors, the gate component corresponding to a semi-static cross-coupled inverter circuit.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

As stated above, synchronous circuits are susceptible to side channel attacks (SCA). While techniques of addressing and overcome SCAs may include the use of clockless asynchronous digital designs, such as speed independent circuit and delay independent circuits, these techniques fail to complete remove the clocks and are also space inefficient.

The two-transistor level delay based circuit as described in the present disclosure addresses and overcome the above described deficiencies. In particular, in an embodiment, the two-transistor level delay based circuit includes an nMOS active resistor and a plurality of nMOS transistors and a pMOS active resistor and a plurality of pMOS transistors such that at least a subset of the plurality of nMOS transistors are coupled according to a parallel OR configuration and at least a subset of the plurality of pMOS transistors are coupled according to the parallel OR configuration. Additionally, a source terminal of the nMOS active resistor is coupled to respective drain terminals of the plurality of nMOS transistors and a source terminal of the pMOS active resistor is coupled to respective drain terminals of the plurality of pMOS transistors, a write sub-circuit component includes at least one of the plurality of nMOS transistors coupled to at least one of the plurality of pMOS transistors, in which the write sub-circuit is controlled by reverse logic signals, and a gate component includes an additional subset of the plurality of nMOS transistors coupled to an additional subset of the plurality of pMOS transistors, the gate component corresponding to a semi-static cross-coupled inverter circuit.

In embodiments, it is noted that two level Null Convention Logic ("NCL") based threshold gates, designated as "THmn" gates, have n-inputs (with "n" being representative of a total number of inputs for these gates) and a threshold value of m. It is also noted that a subset of the NCL based threshold gates in which the total number of inputs ("n") to the NCL based threshold gates is equal to the threshold value (m) are described as Muller C-Elements. The two-transistor level delay based circuit of the present disclosure is applicable for and operates for the subset of the NCL based threshold gates in which the inputs (n) equal the threshold value (m). It is further noted that Muller C-Elements are used for a variety of different types of asynchronous circuits in addition to circuits used in NCL based or NCL specific applications.

Figure 1:
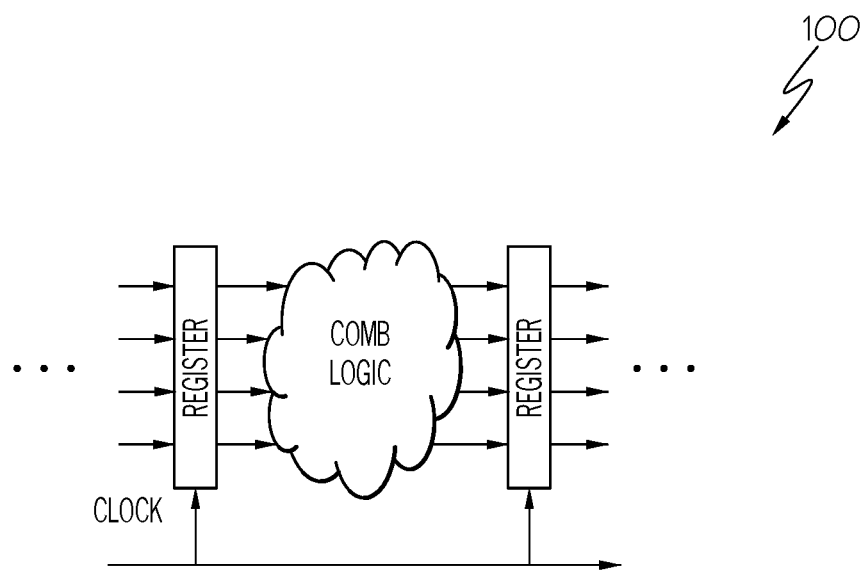
FIG. 1 depicts a synchronous sequential dataflow circuit, according to one or more embodiments described and illustrated herein.

FIG. 1 depicts a synchronous sequential dataflow circuit 100, according to one or more embodiments described and illustrated herein. It is noted that synchronous sequential circuits are digital circuits in which the feedback to the input for the purposes of generating a particular output is governed by clock signals. Operation of such circuits are predictable and easy to design. However, due to propagation delay associated with the clock signal reaching all elements of the circuit, the synchronous sequential circuits have slower operational speeds relative to asynchronous circuits.

Synchronous sequential circuits are typically used in counters, shift registers, memory units, and so forth. As illustrated in FIG. 1, the synchronous sequential dataflow circuit 100 uses a register bit-width of four signal registers. It is also noted that the combination logic, as illustrated in FIG. 1, may be utilized to generate a particular output.

Figure 2:
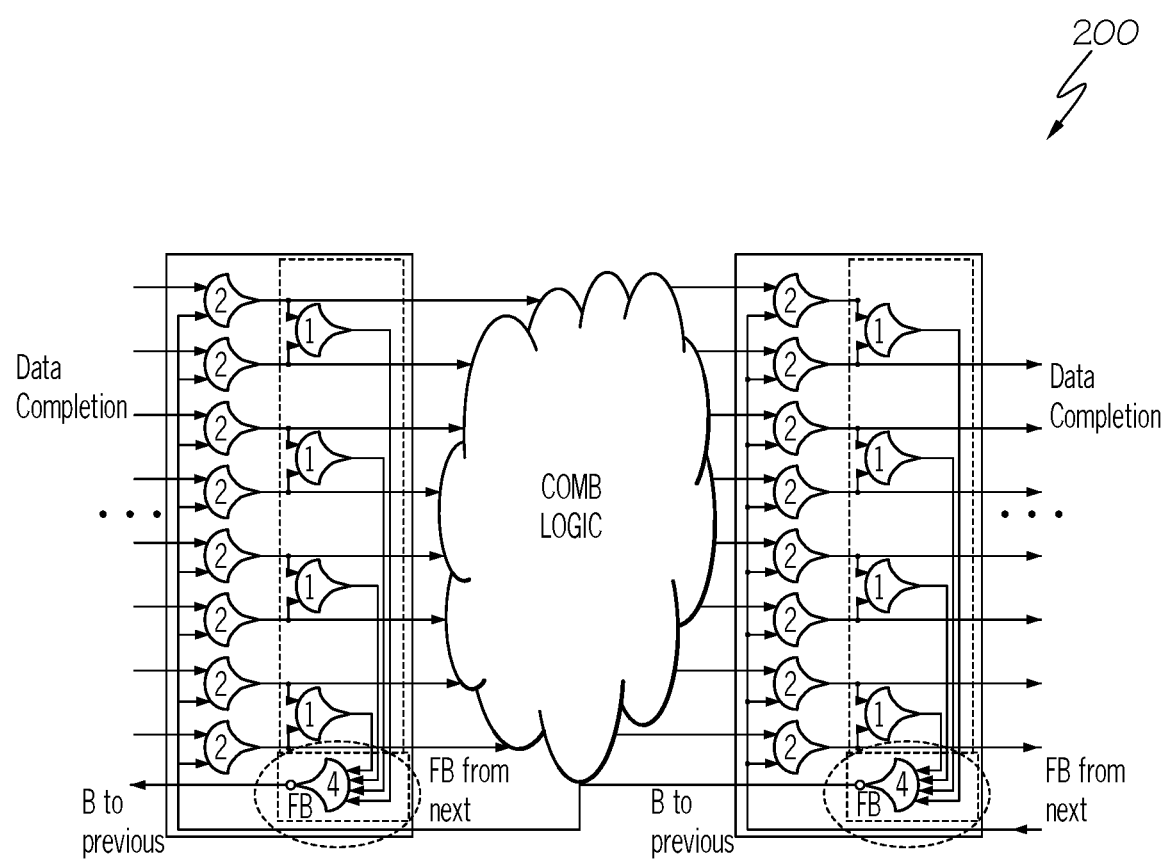
FIG. 2 depicts an NCL asynchronous dataflow circuit with asynchronous registers, according to one or more embodiments described and illustrated herein

FIG. 2 depicts an NCL asynchronous dataflow circuit 200 with asynchronous registers, according to one or more embodiments described and illustrated herein. A key component of handshaking or communication connection establishment of the NCL asynchronous dataflow circuit 200 is a traditional feedback circuit (TFBC), which is indicated with circle shaped dotted lines. The traditional feedback circuits include TH44 gates that include an inverter positioned on outputs of these gates. The notation "THmm" is descriptive of the elements of Muller C-elements and "mm" may be representative of digits (relating to input bits). It is noted that "THmm" gates correspond to Muller C-Elements that are classified as a subset of the NCL based threshold gates "THmn", described above. Additionally, as stated above, it is noted that Muller C-Elements are operational in and usable for a variety of different types of asynchronous circuits, particularly in addition to circuits used in NCL based or NCL specific applications. In embodiments, during operation of the NCL asynchronous dataflow circuit 200, for inputs bits that are equal to or larger than 5, the traditional feedback circuit may be implemented by combining or staging up smaller gates such as, e.g., TH44 gate that is illustrated in FIG. 2. In embodiments, it is noted that a size and delay of the traditional feedback circuits may be based on a function of the number of TFBC inputs, represented by "N", and a single "THmm" Muller C-element may be utilized where a register bit-width is equal to a particular number of input bits.

Figure 3A:
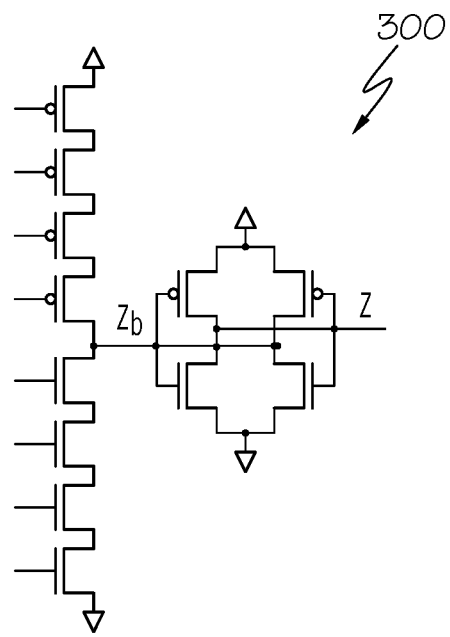
FIG. 3A depicts a traditional complementary metal oxide semiconductor ("CMOS") based implementation of a conventional semi-static TH44, according to one or more embodiments described and illustrated herein.

FIG. 3A depicts a traditional complementary metal oxide semiconductor ("CMOS") based implementation of a conventional semi-static TH44 300, according to one or more embodiments described and illustrated herein. In embodiments, it is noted that a limitation of the CMOS based implementation of the conventional semi-static TH44 300 is that a number of transistors that are connected in series for a significant number of technology nodes are restricted to an input bid-width of four. It is noted that the traditional CMOS based implementation of the conventional semi-static TH44 300 includes a 12 transistor based dual or two-level delay semi-static TH44 threshold gate.

Figure 3B:
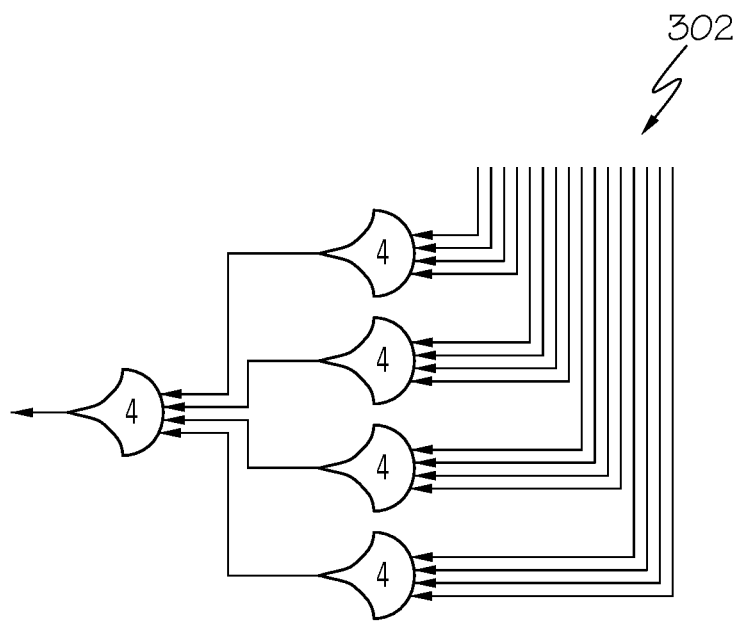
FIG. 3B depicts an example 16 THmm Muller C-Element implementation of a five-staged TH44 gate circuit, according to one or more embodiments described and illustrated herein, according to one or more embodiments described and illustrated herein.

FIG. 3B depicts an example 16 THmm Muller C-Element implementation of a five-staged TH44 gate circuit 302, according to one or more embodiments described and illustrated herein. As illustrated, the 16 THmm Muller C-Element implementation of a five-staged TH44 gate circuit 302 is designed and dedicated for a 16-signal NCL TFBC register. The gate circuit 302 utilizes five TH44 cells summing up to a total of four transistor delays and 60 total transistors. As illustrated in FIG. 3B, smaller THmm Muller C-elements are staged or combine to form larger THmm Muller C-Elements and the smaller Thmm Muller C-element may be either static or semi-static it is noted that, as illustrated in FIG. 3B, smaller Muller C-elements are staged or combined to form larger Muller C-Elements.

Figure 4A:
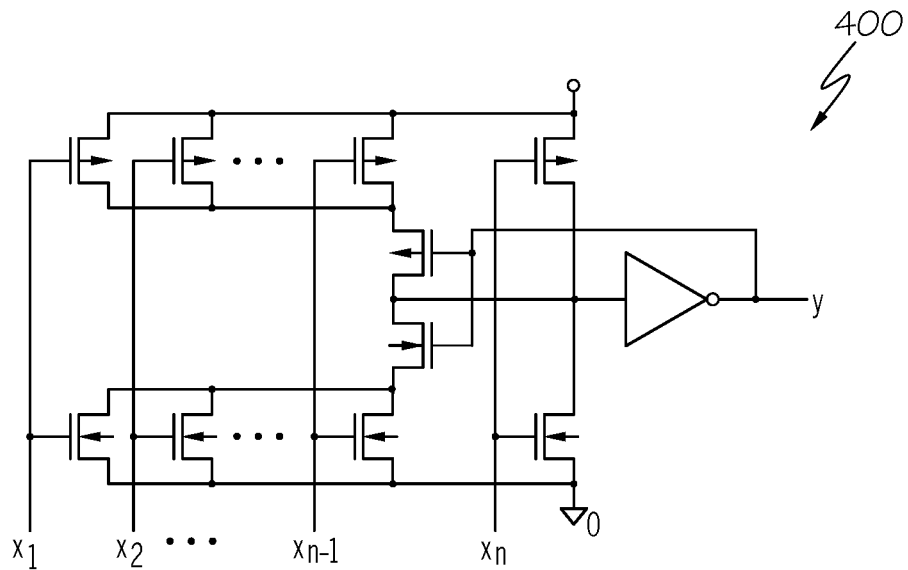
FIG. 4A depicts an example Muller C-Element circuit implementation 400 with certain restrictions and limitations, according to one or more embodiments described and illustrated herein.

FIG. 4A depicts an example Muller C-Element circuit implementation 400 with certain restrictions and limitations, according to one or more embodiments described and illustrated herein. As illustrated, the example Muller C-Element circuit implementation is based on carefully and particularly sizing a set of weak transistors. In embodiments, a limitation of the example Muller C-Element circuit implementation 400 is that its operation is dependent on the sequence or order in which inputs of the circuits switch. As stated above, Muller C-Elements are classified as a subset of the NCL based threshold gates "THmn", and are operational in and usable for a variety of different types of asynchronous circuits, particularly in addition to circuits used in NCL based or NCL specific applications.

Figure 4B:
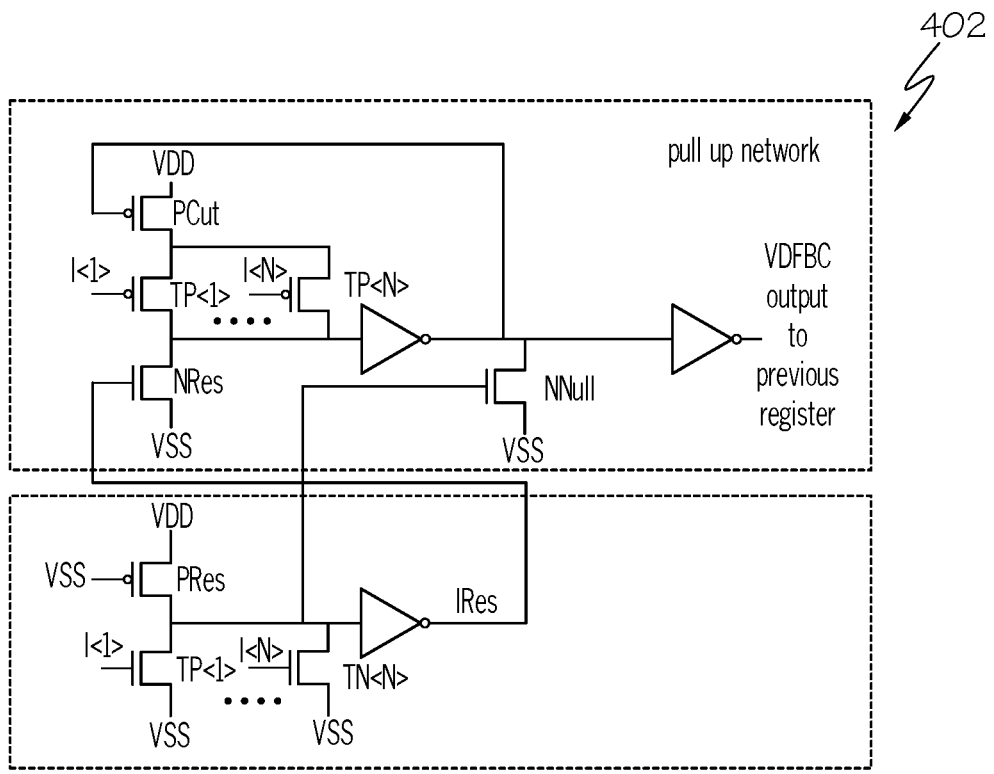
FIG. 4B depicts an example voltage divider based feedback circuit, according to one or more embodiments described and illustrated herein.

FIG. 4B depicts an example voltage divider based feedback circuit 402, according to one or more embodiments described and illustrated herein. In embodiments, in operation, the only time that zero static power may be drawn for the example voltage divider based feedback circuit 402 may be when all of the inputs are '0'. This is a limitation of the circuit. Additionally, in embodiments, another limitation of the voltage divider based feedback circuit 402 is that this circuit consumes large amounts of power, e.g., twice an amount that is typically consumed by other circuits.

The system for null convention logic based applications having large bit-widths that includes a two-transistor level delay based circuit, as described in the present disclosure, addresses and overcome the limitations of the circuit designs described above.

Figure 5A:
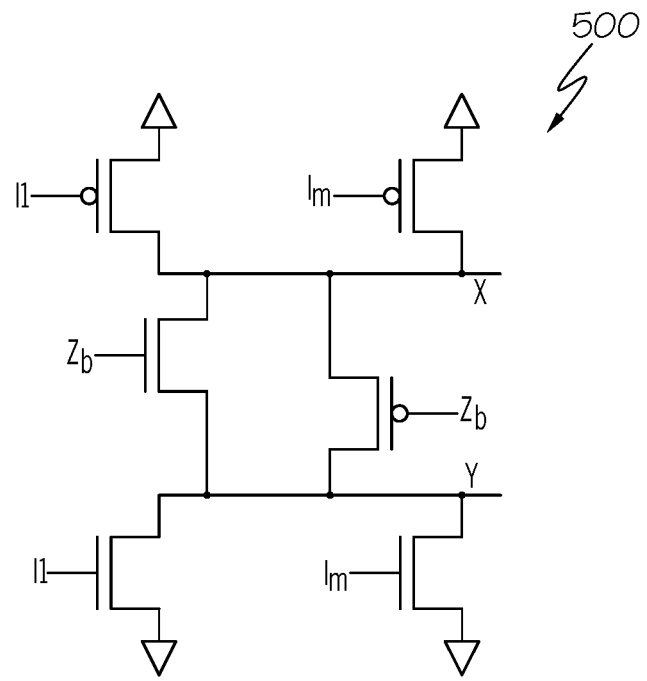
FIG. 5A depicts a modified EMC reverse logic based sub circuit, which is part of the two-transistor level delay based circuit of the present disclosure, according to one or more embodiments described and illustrated herein.

FIG. 5A depicts a modified EMC reverse logic based sub circuit 500, which is part of the two-transistor level delay based circuit of the present disclosure, according to one or more embodiments described and illustrated herein. It is noted that the sub circuit 500 is a result of a modification of a particular transistor-resistor circuit implementation in which a combination of sub-circuits is always active or in an ON position, as a result of which static power is always drawn through the active resistors. The consistent drawing of static power through the active resistors reduces the operational effectiveness of conventional circuits. The sub circuit 500 illustrated in FIG. 5A addresses and overcomes this deficiency. In particular, the design of the sub circuit 500 ensures that neither the top circuit (e.g., the set circuit) within the sub circuit 500 or the bottom circuit of the sub circuit 500 (e.g., the reset circuit) draws or extracts power when all inputs are '0' or '1'. Additionally, the design of the sub circuit 500 ensures that while the inputs are transitioning from '0' to '1' or from '1' to '0', only one of the resistive transistors is active.

In embodiments, an inverted output "$Z_b$" of the modified EMC reverse logic based sub circuit 500 is routed or fed back to the control gates for each of the nMOS and pMOS active resistors. It is noted that the middle portion of the sub circuit 500 illustrates the nMOS and pMOS active resistors. Due to such routing of the output—inverted output $Z_b$—and depending on the state of the output, only one of the two active resistors will ever be in the "ON" state at any give time. In this way, the limitation of the drawing or extraction of power when the inputs are '0' or '1' is addressed and overcome. It is noted that, as illustrated in FIG. 5A, the source terminal of the pMOS active resistor is moved or positioned relative to the drain terminals of the pMOS input transistors. It is further noted that the pMOS transistors—transistors positioned on the top portion of the sub circuit 500—are connected or coupled to one another according to a parallel OR configuration. Additionally, the source terminal of the nMOS active resistor may be moved or positioned relative to the drain terminals of the nMOS input transistors. It is further noted that the nMOS transistors—transistors positioned on the bottom portion of the sub circuit 500—are connected or coupled to one another according to a parallel OR configuration. The pMOS and nMOS active resistors are illustrated in the middle portions of the sub circuit 500, namely circuits in which the inverted outputs are $Z_b$, respectively. The feeding back of the output $Z_b$ to the control gates of the nMOS and pMOS active resistors and the positioning of the source terminals of the nMOS and pMOS active resistors, respectively, to the drain terminals of the nMOS and pMOS input transistors, ensures that there is no path from VDD to Vss when all inputs are either at a '0' state or a '1' state. Consequently, power is conserved when the sub circuit is in a rest state—when all inputs are '0' or all inputs are '1', or when the sub circuit is transitioning between states—when a subset of the inputs are '0' and another subset of the inputs is '1'.

Figure 5B:
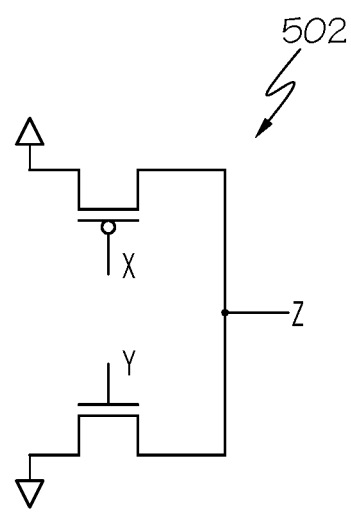
FIG. 5B depicts a write sub circuit, which is part of the two-transistor level delay based circuit of the present disclosure, according to one or more embodiments described and illustrated herein.

FIG. 5B depicts a write subcircuit 502, which is part of the two-transistor level delay based circuit of the present disclosure, according to one or more embodiments described and illustrated herein. As illustrated, the write subcircuit 502 includes at least one of the plurality of nMOS transistors coupled to at least one of the plurality of pMOS transistors and is controlled by reverse logic signals. It is also noted that the write subcircuit 502 is based on a modified t-gate design. In operation, regarding node Y, when all inputs are reset to '0' from '1', the transistor will be in the "ON" position, modifying the value of "Z" to a reset value of '0'. The rest of the time, node Y may be in an "OFF", thereby not affecting the value of "Z". Additionally, regarding node X, when all inputs are set to a value of '1', the transistor X may be in the "ON" position, modifying the value of "Z" to a reset value of '0'. The rest of the time, the transistor X may be in an "OFF" state.

It is noted that the widths of the nMOS and pMOS transistors in the write subcircuit 502 are based on a particular type of output stage. For example, if a traditional semi-static, cross-coupled inverter is chosen, the widths of the transistors are designed and sized such that when the transistors are "ON", the transistors have a sufficiently low resistance to override the cross coupled inverter that drives the output designated as "Z" (and is driven by "$Z_b$") as illustrated in FIG. 5A. In other embodiments, if a particular amplifier output stage is chosen (e.g., a sense-amplifier output stage), the widths of nMOS and pMOS transistors in the write subcircuit can be designed to have small dimensions, as a result of which space and area may be saved.

Figure 5C:
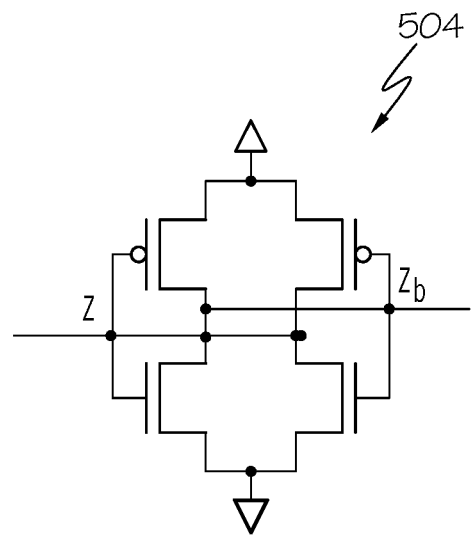
FIG. 5C depicts an EMC Muller C-Element gate component included as part of the two-transistor level delay based circuit of the present disclosure, according to one or more embodiments described and illustrated herein.

FIG. 5C depicts an EMC Muller C-Element gate component 504 included as part of the two-transistor level delay based circuit of the present disclosure, according to one or more embodiments described and illustrated herein. As illustrated, the EMC Muller C-Element gate component 504 implements digital hysteresis when the output "Z" is set and reset (e.g., from '1' to '0') and minimizes load on the write sub circuit 502, as illustrated in FIG. 5B. The gate component includes an additional subset of the plurality of nMOS transistors coupled to an additional subset of the plurality of pMOS transistors, and corresponds to a semi-static cross-coupled inverter output stage (or semi-static cross-coupled inverter circuit).

Figure 5D:
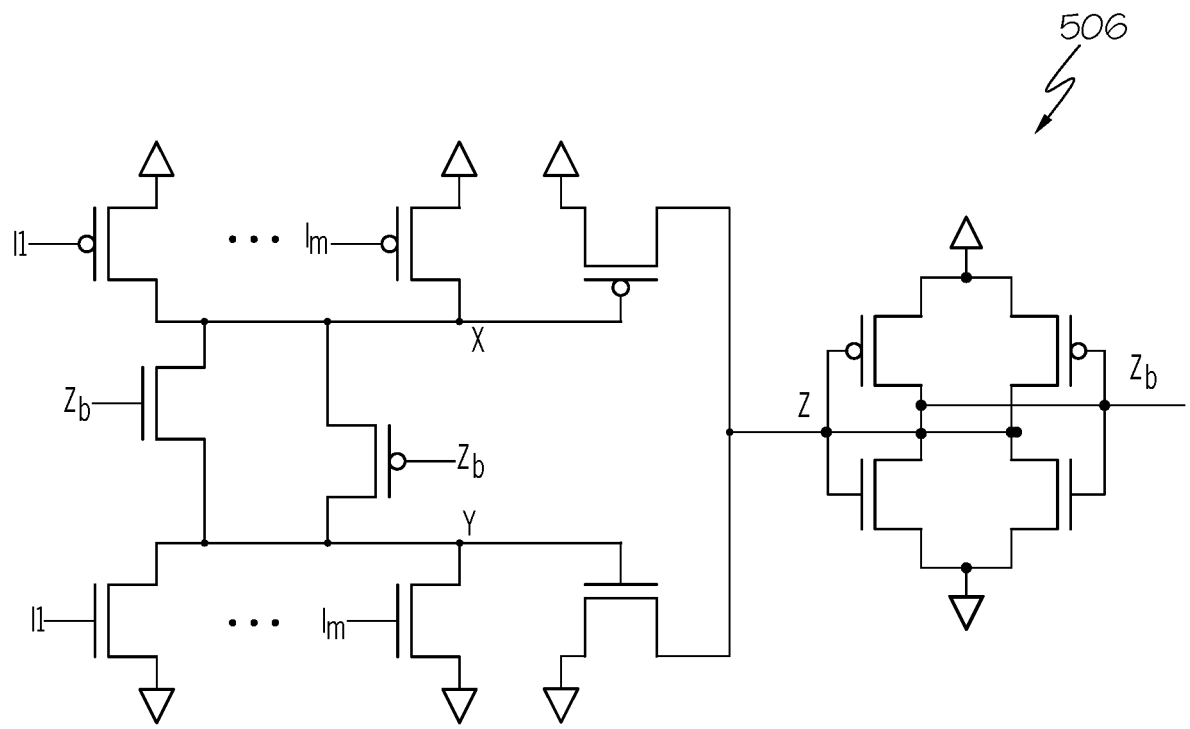
FIG. 5D depicts the two-transistor level delay based circuit of the present disclosure that includes each of the modified EMC reverse logic based sub circuit illustrated in FIG. 5A, a write sub circuit illustrated in FIG. 5B, and an EMC Muller C-Element gate component illustrated in FIG. 5C coupled to each other, according to one or more embodiments described and illustrated herein, according to one or more embodiments described and illustrated herein.

FIG. 5D depicts the two-transistor level delay based circuit 506 of the present disclosure that includes each of the modified EMC reverse logic based sub circuit 500 illustrated in FIG. 5A, a write sub circuit 502 illustrated in FIG. 5B, and an EMC Muller C-Element gate component 504 illustrated in FIG. 5C coupled to each other, according to one or more embodiments described and illustrated herein. As detailed above, the two-transistor level delay based circuit 506 is designed to and operates such that it reduces the delays and may be leveraged such that it reduces or eliminates a limit on a number of inputs to the two-transistor level delay based circuit 506. It is further noted that the two-transistor level delay based circuit 506 has zero static power draw when all of the inputs to the two-transistor level delay based circuit 506 are '0' and when all of the inputs to two-transistor level delay based circuit 506 are '1'. The two-transistor level delay based circuit 506 also ensures that only one active resistor is in an "ON" position at any given time. In embodiments, in situations when all inputs are either '0' or '1', both the active resistors will be in an "OFF" position.

Figure 5E:
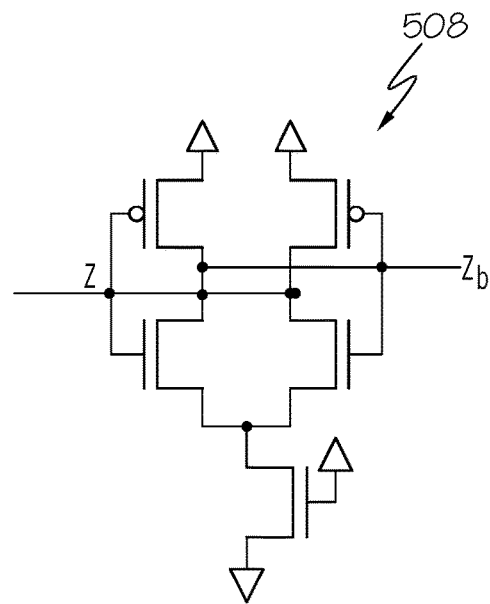
FIG. 5E depicts a different implementation of an EMC Muller C-Element gate component included as part of the two-transistor level delay based circuit of the present disclosure, according to one or more embodiments described and illustrated herein, according to one or more embodiments described and illustrated herein.

FIG. 5E depicts a different implementation of an EMC Muller C-Element gate component 508 included as part of the two-transistor level delay based circuit of the present disclosure, according to one or more embodiments described and illustrated herein. The different implementation corresponds to a sense-amplifier output stage or circuit. As illustrated, the EMC Muller C-Element gate component 508 is designed to include an addition nMOS transistor as compared to the EMC Muller C-Element gate component 504 illustrated in FIG. 5C. Additionally, the different implementation of the EMC Muller C-Element gate component 508 is configured to perform a digital hysteresis function and maintain the value of the output of the two-transistor level delay based circuit (e.g., "Z") until certain conditions for modifying the value of the output are met.

Figure 5F:
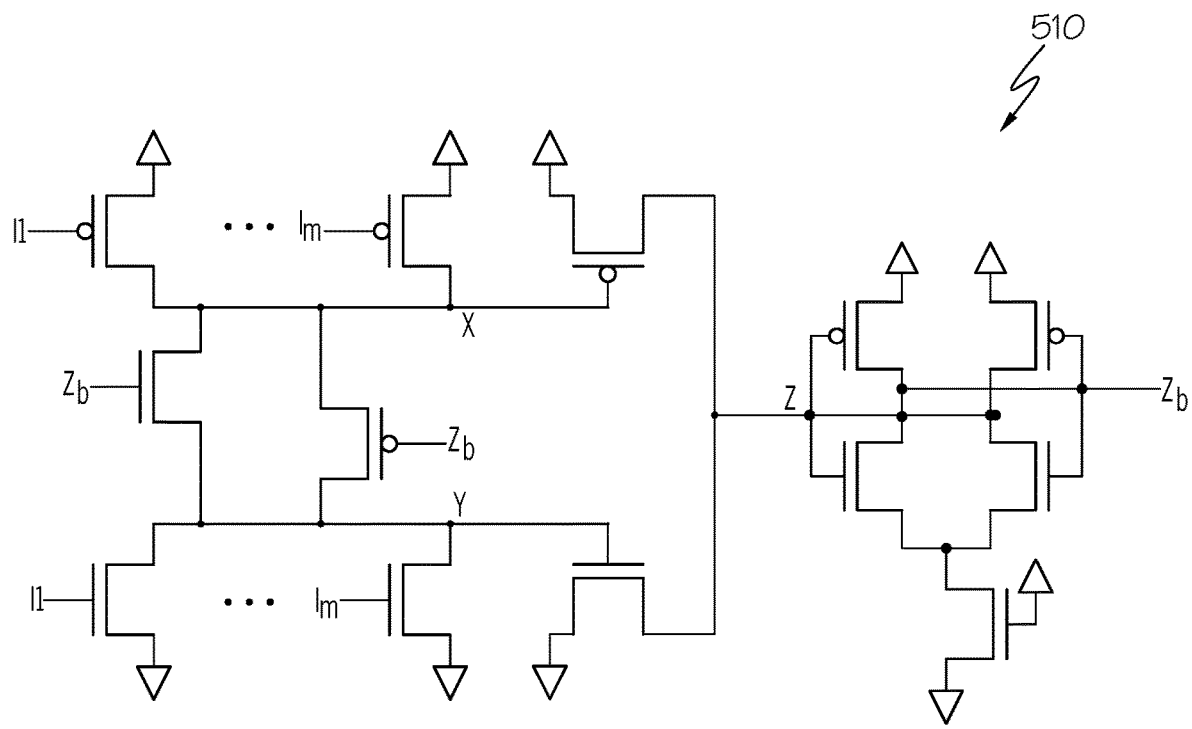
FIG. 5F depicts the two-transistor level delay based circuit of the present disclosure that includes each of the modified EMC reverse logic based sub circuit illustrated in FIG. 5A, a write sub circuit illustrated in FIG. 5B, and the different implementation of the EMC Muller C-Element gate component illustrated in FIG. 5F coupled to each other, according to one or more embodiments described and illustrated herein.

FIG. 5F depicts the two-transistor level delay based circuit 510 of the present disclosure that includes each of the modified EMC reverse logic based sub circuit 500 illustrated in FIG. 5A, a write sub circuit 502 illustrated in FIG. 5B, and the different implementation of the EMC Muller C-Element gate component 508 illustrated in FIG. 5F coupled to each other, according to one or more embodiments described and illustrated herein. As detailed above, the two-transistor level delay based circuit 510 is also designed to and operate such that it reduces the delays and may be leveraged such that it reduces or eliminates a limit on a number of inputs to the two-transistor level delay based circuit 510. It is further noted that the two-transistor level delay based circuit 506 has zero static power draw when all of the inputs to the two-transistor level delay based circuit 506 are '0' and when all of the inputs to two-transistor level delay based circuit 506 are '1'. The two-transistor level delay based circuit 510 also ensures that only one active resistor is in an "ON" position at any given time. In embodiments, in situations when all inputs are either '0' or '1', both the active resistors will be in an "OFF" position.

As described in the present disclosure, two level Null Convention Logic ("NCL") based threshold gates, designated as "THmn" gates, have n-inputs and a threshold value of m. In embodiments, a subset of the NCL based threshold gates in which the total number of inputs ("n") to the NCL based threshold gates is equal to the threshold value (m) are described as Muller C-Elements. The two-transistor level delay based circuit of the present disclosure is applicable for and operates for the subset of the NCL based threshold gates in which the inputs (n) equal the threshold value (m). It is also noted that the Muller C-Elements are used for a variety of different types of asynchronous circuits in addition to NCL based or NCL specific applications.

Figure 6:
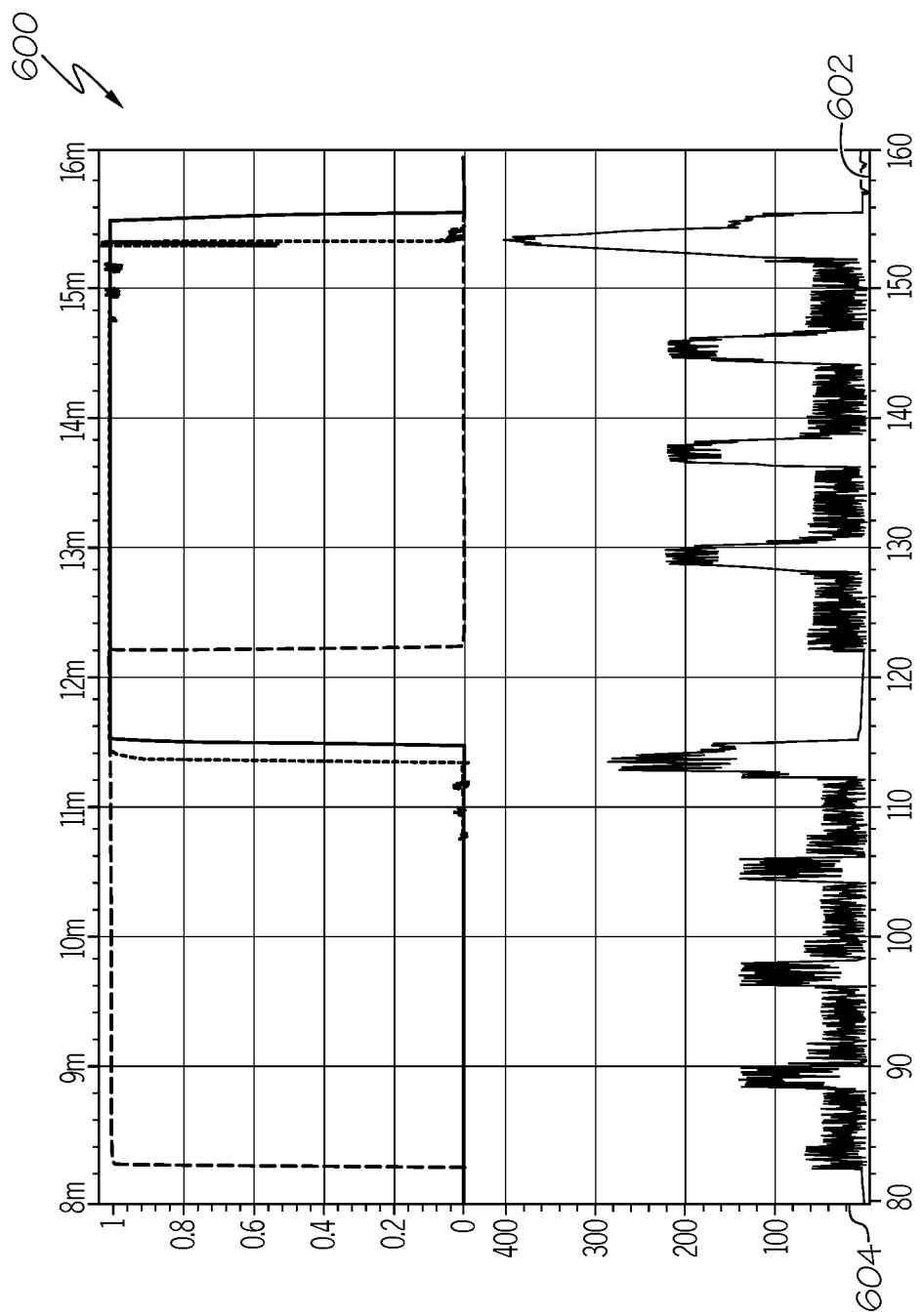
FIG. 6 depicts a graphical waveform representation corresponding to results from test waveforms for a traditional, staged-up $TH_{6464}$ circuit, according to one or more embodiments described and illustrated herein.

FIG. 6 depicts a graphical waveform representation 600 corresponding to results from test waveforms for a traditional, staged-up $TH_{6464}$ circuit, according to one or more embodiments described and illustrated herein. In embodiments, for generating the waveforms in FIG. 6, a traditional $TH_{6464}$ Muller C-Element circuit was compared to a new EMC $TH_{6464}$ Muller C-Element with semi-static, cross-coupled inverter output stage or circuit. As part of the simulation, all circuit inputs were reset to a value of '0'. Thereafter, all inputs were again individually set to '1' and then subsequently reset to '0'. In this way, input signals went through multiple set and reset cycles, and the same input sequences were used multiple test cases. The test was performed successfully for bid-width values of inputs in which m is 1024.

In the graphical waveform representation 600, the first input transitioning from '0' to '1' and the last input to change from '1' to 0 are depicted. In particular, the x-axis 602 corresponds to time values and the y-axis 604 corresponds to bit-width values. As part of the testing process, all inputs were driven by same sized buffers and outputs, and the same sized loads. It is further noted that, as part of the test, all transistor lengths were selected and designed to be as low as possible and all transistor widths were also designed to be as low as possible. The delay values for all circuits were calculated by averaging the different in the time the output "Z" reached 50% of its stable value from the time the last input to change reached 50% of its stable value. Additionally, average power was calculated by averaging the numerical data used for the plots during an appropriate test period. The average power consumption, illustrated in the bottom portion of the graph, indicates that there is a spike during the periods of transitions, namely when the output changes from '0' to '1' and when the output again changes from '1' to '0'.

Figure 7:
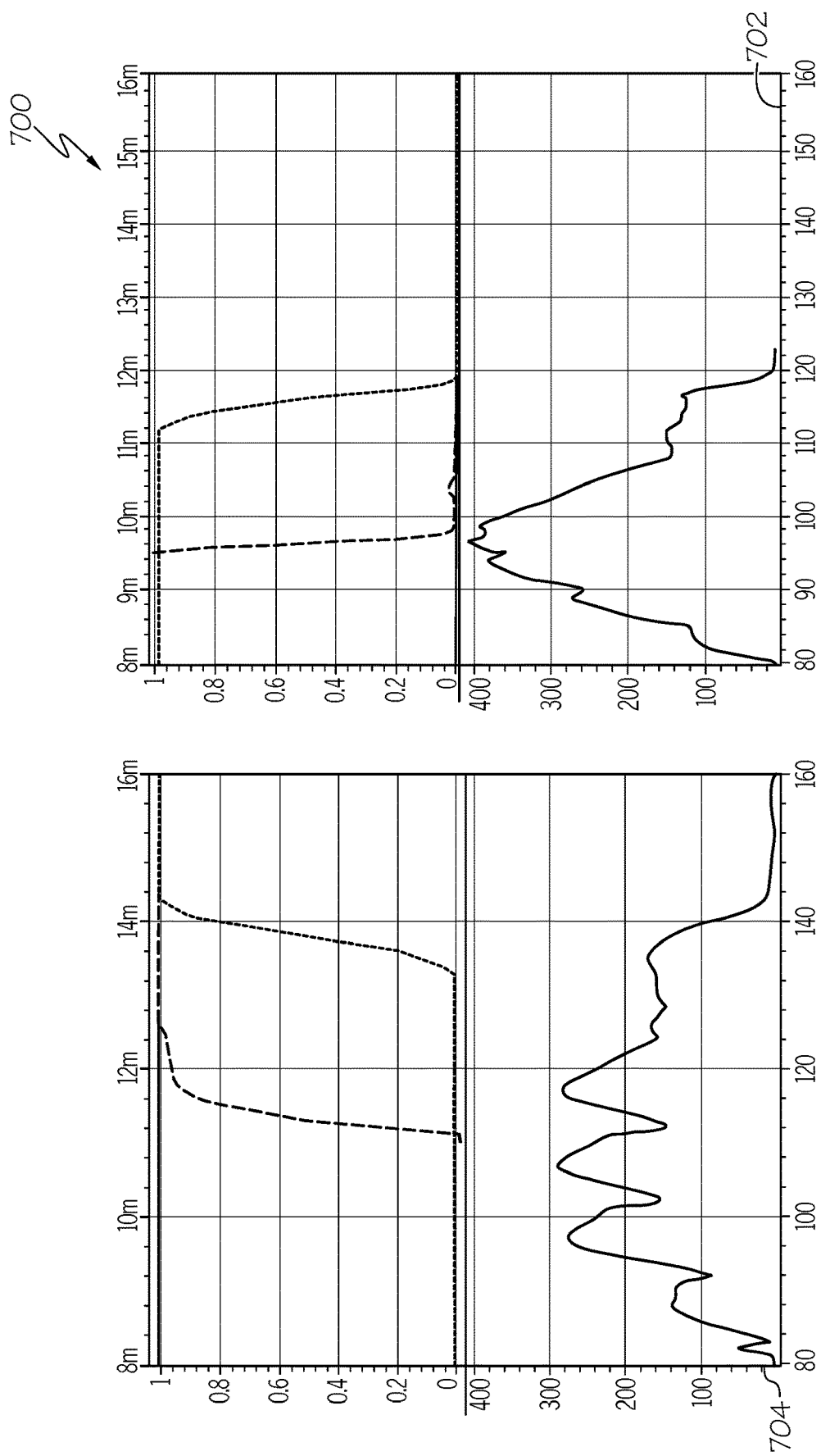
FIG. 7 also depicts another graphical waveform representation corresponding to results from test waveforms for a traditional, staged-up $TH_{6464}$ circuit, according to one or more embodiments described and illustrated herein.

FIG. 7 also depicts another graphical waveform representation 700 corresponding to results from test waveforms for a traditional, staged-up $TH_{6464}$ circuit, according to one or more embodiments described and illustrated herein. As illustrated, the graphical waveform representation 700 illustrates an output transition when an input (e.g., a last input) is set to a value of '1' in order to meet the threshold inputs and set the output value of 'Z' to '1', and another output transition when the last input is reset to '0' in order to reset the output Z back to '0'.

Figure 8:
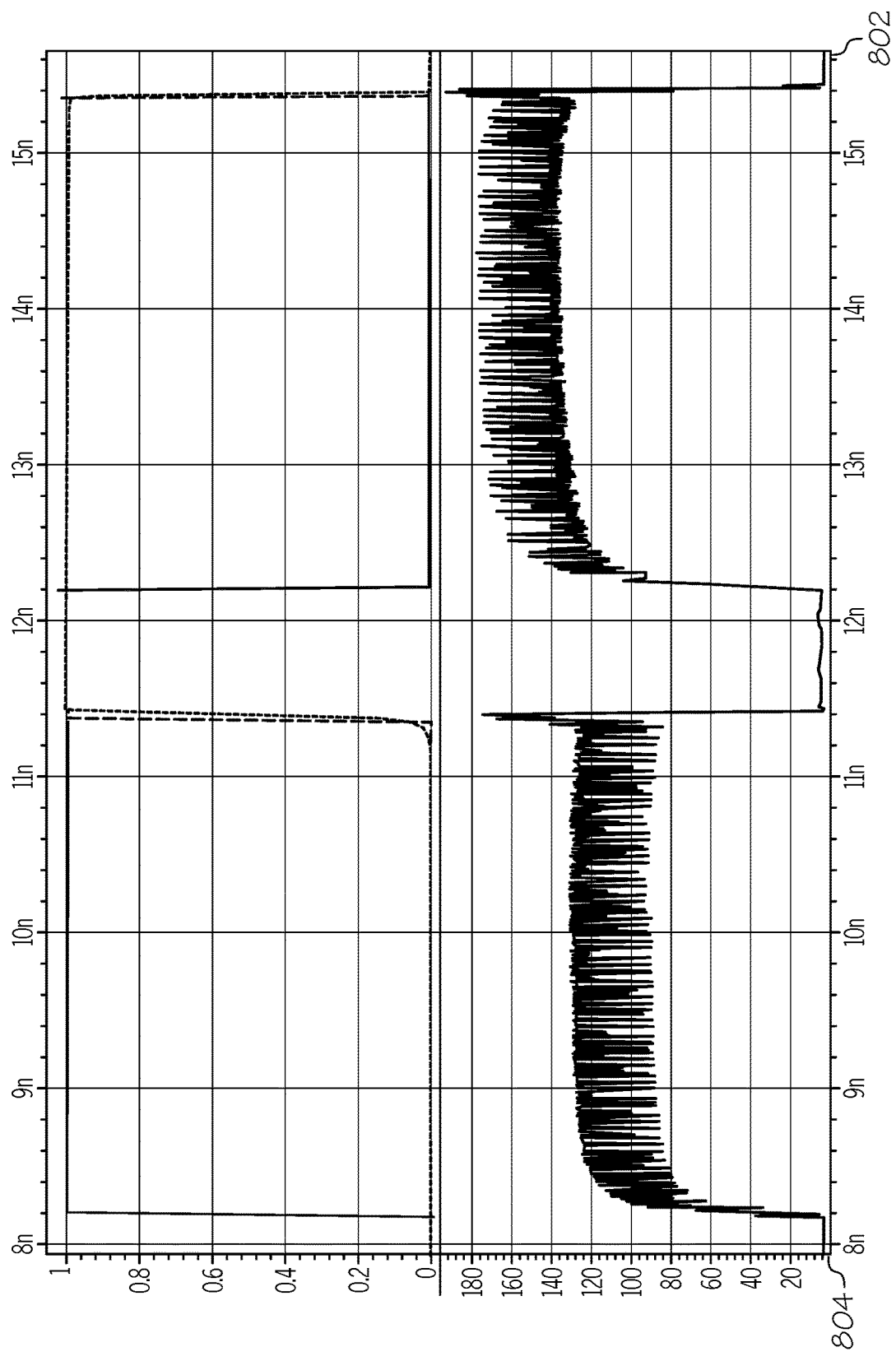
FIG. 8 depicts a graphical waveform representation that includes functional and power simulation waveforms for the two-transistor level delay based circuit, according to one or more embodiments described and illustrated herein.

FIG. 8 depicts a graphical waveform representation 800 that includes functional and power simulation waveforms for the two-transistor level delay based circuit, according to one or more embodiments described and illustrated herein. A comparison of the graphical waveform representation 800 with the graphical waveform representations 600 and 700 illustrates a discernable delay during operation of the $TH_{6464}$ gates as shown in the graphical waveform representations 600 and 700. In contrast, in the graphical waveform representation 800 of the two-transistor level delay based circuit of the present disclosure, there is a minimal or negligible delay in an output as a result of a change in an input, e.g., from '0' to '1', and another minimal or negligible delay in another output as a result of resetting of the input from '1' to '0'. As compared to the operation of the traditional staged-up $TH_{6464}$ circuit, the two-transistor level delay based circuit of the present disclosure ensures that the static power consumption when both circuits are at rest (e.g., when all inputs are reset to the same '0' value or set to the same '1' value) is low or minimal. It is noted that an advantage of the two-transistor level delay based circuit is that it enables faster switching times between two gates, e.g., when the input switches from '0' to '1' and from '1' to '0'. In addition, another advantage of the two-transistor level delay based circuit of the present disclosure is that the total number of transistors used for appropriate operation of the two-transistor level delay based circuit is lower than the traditional staged-up $TH_{6464}$ circuit. It is further noted that sizes of the nMOS active resistor and the pMOS active resistor of the two-transistor level delay based circuit of the present disclosure serve to directly control the delay and power consumption of the two-transistor level delay based circuit.

Figure 9:
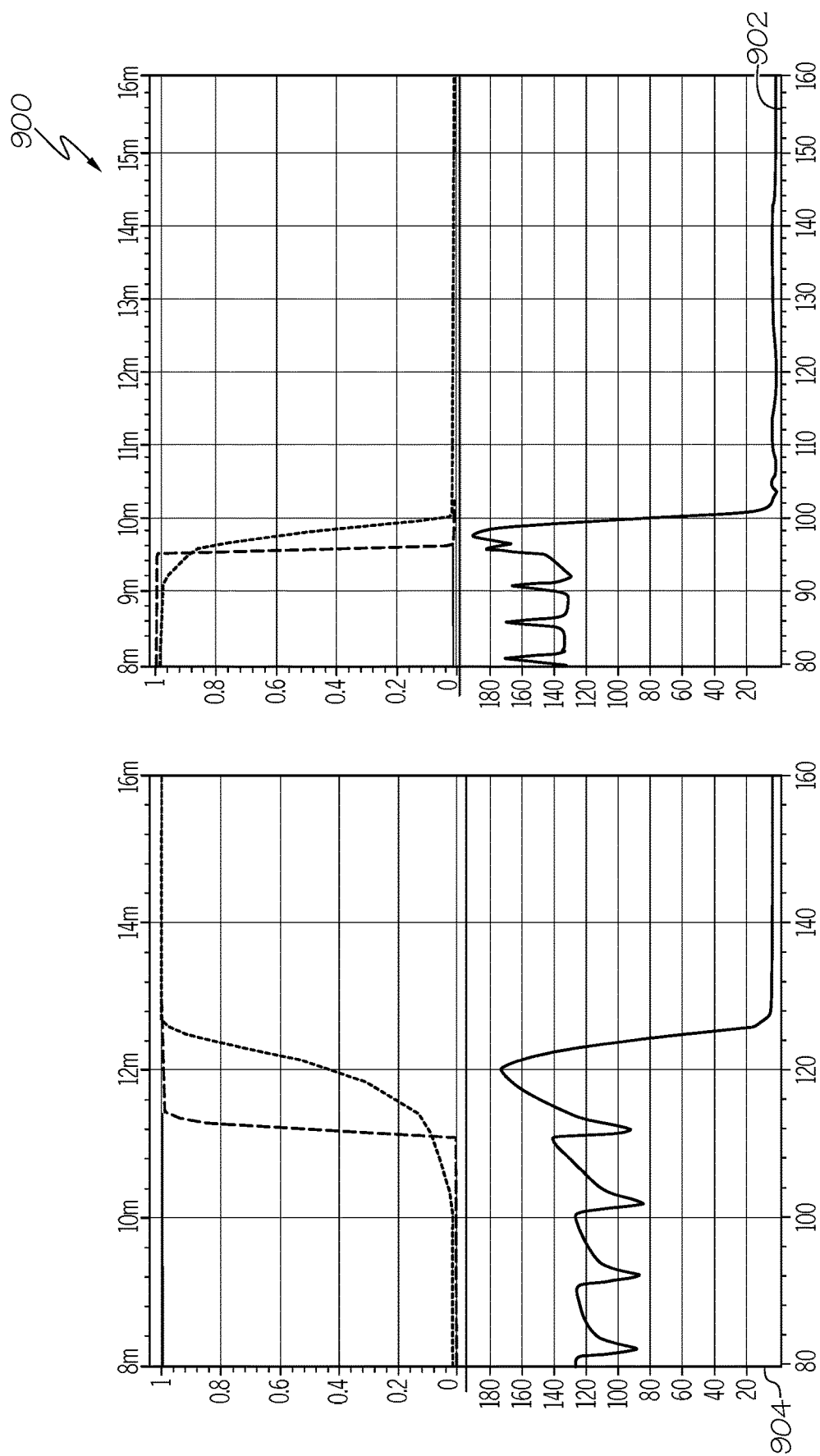
FIG. 9 depicts a different graphical waveform representation that illustrates functional and power simulation waveforms for a different implementation of the two-transistor level delay based circuit, namely the implementation that includes a semi-static, cross-coupled inverter output stage or circuit as shown in FIGS. 5E and 5F, according to one or more embodiments described and illustrated herein.

FIG. 9 depicts a different graphical waveform representation 900 that illustrates functional and power simulation waveforms for a different implementation of the two-transistor level delay based circuit, namely the implementation that includes a semi-static, cross-coupled inverter output stage or circuit as shown in FIGS. 5E and 5F, according to one or more embodiments described and illustrated herein. The different graphical waveform representation 900 includes an x-axis 902 that corresponds to time and a y-axis 904 that corresponds to input bit-widths. In particular, the different graphical waveform representation 900 illustrates output transitions from '0' to '1' and from '1' to '0' as a result of changes in input from '0' to '1' and from '1' to '0', respectively. As illustrated, the delay between the inputs and outputs during the transitions are minimal or negligible. Additionally, static power consumption levels or spikes during the input and output transitions are lower relative to the power consumptions levels of the traditional staged-up $TH_{6464}$ circuit described above.

Figure 10:
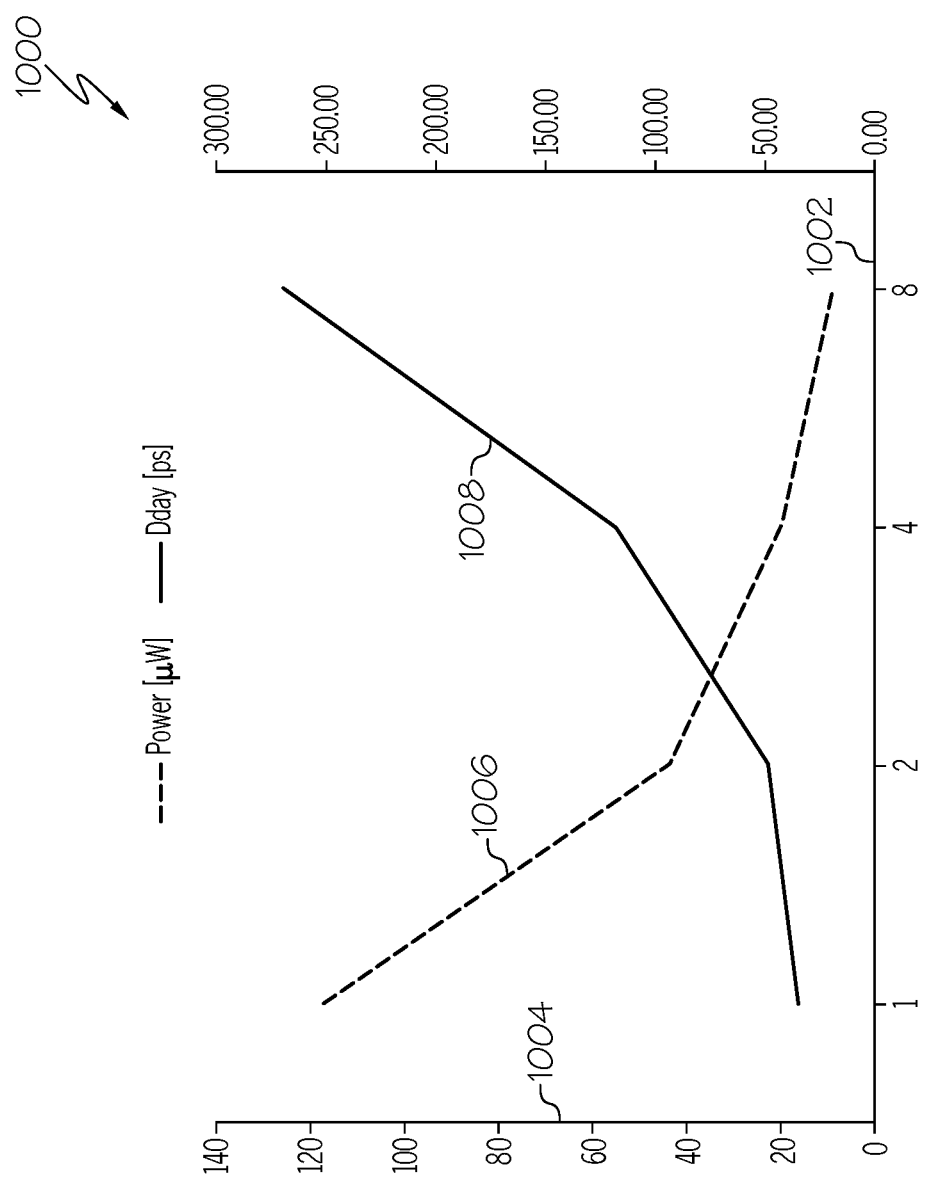
FIG. 10 depicts a graphical representation that includes relative average transitional power consumption and delay of the two-transistor level delay based circuit as a function of the active resistor channel length multiplier, according to one or more embodiments described and illustrated herein.

FIG. 10 depicts a graphical representation 1000 that includes relative average transitional power consumption and delay of the two-transistor level delay based circuit as a function of the active resistor channel length multiplier, according to one or more embodiments described and illustrated herein. The graphical representation 1000 includes an x-axis 1002 that corresponds to channel length ranging from 1-8, and y-axis 1004 that corresponds to power consumption. An additional y-axis is included that corresponds to delay. As illustrated, as the channel length increases, the delay 1008 also increases and the power consumption 1006 reduces. The curves or graphs for delay 1008 and power consumption 1006 have an approximately inverse relationship.

Table 1, provided below, includes a comparison of various factors between the traditional staged-up $TH_{6464}$ circuit and the two-transistor level delay based circuit of the present disclosure, according to one or more embodiments described and illustrated herein.

|  | Traditional Staged-up $TH_{6464}$ Circuit | EMC $TH_{6464}$ Circuit |
| --- | --- | --- |
| Number of Transistors | 252 | 136 |
| Number of Transistor Delays | 6 | 2 |
| Simulated Delays [ps] | 165.3 | 35.1 |
| Average Power at Rest [uW] | 8.1 | 2.1 |
| Average Power/Test Cycle [uW] | 38.7 | 117.0 |

As shown in the table, the total number of transistors, the number of transistor delays and simulated delays, and the average power at rest is significantly lower for the two-transistor level delay based circuit of the present disclosure as compared to the traditional staged-up $TH_{6464}$ circuit described above. For at least these reasons, the two-transistor level delay based circuit of the present disclosure addresses and overcomes the deficiencies of, e.g., traditional staged-up $TH_{6464}$ circuit described above.

Figure 11A:
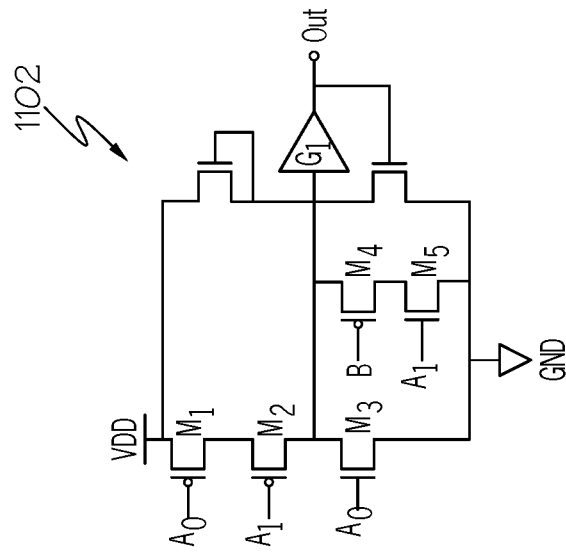
FIGS. 11A and 11B depict respective CMOS Designs corresponding to transistor diagrams of datapath gates, according to one or more embodiments described and illustrated herein.
Figure 11B:
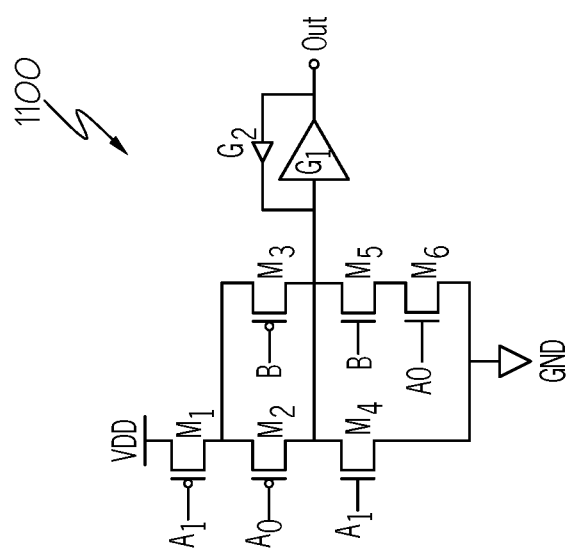

FIGS. 11A and 11B depict respective CMOS Designs 1100 and 1102 corresponding to transistor diagrams of datapath gates, according to one or more embodiments described and illustrated herein. In embodiments, the datapath gate designs illustrated in FIGS. 11A and 11B are particular or custom complimentary metal-oxide-semiconductor gate designs that are configured to receive both asynchronous and synchronous signals simultaneously, while maintaining a particular Boolean functionality. These designs also enable for the conversion of synchronous netlists into hybrid (i.e. synchronous and asynchronous)

netlists. Such designs provide numerous benefits, namely additional security from side channel attacks that target and expose confidential data.

In embodiments, the conversional methodology may be based on timing critical path data of the design and are configured to preserve all functionality of the original netlist. The datapath gates included in these designs may receive both synchronous and asynchronous signals and only perform an execution operation when a value has been set for the asynchronous input. It is also noted that the datapath gates can be utilized to convert a portion of a synchronous netlist, based on a timing critical path or paths, to a hybrid netlist. This hybrid netlist provides added security benefits, namely from side channel attacks, while minimizing the circuit area. It is also noted that these designs keep the return-to-zero (RTZ) characteristic, as a result of which the circuit based on these designs will not perform an execution operation until the asynchronous inputs have been set, irrespective of whether or not the inputs arrive at the gate synchronously. It is noted that the datapaths described above may be included as part of these designing, thereby replacing timing critical paths or paths and simultaneously ensuring that the area is not increased or compromised beyond a certain threshold.

The design method for designing the CMOS Designs 1100 and 1102 is based on a five step process detailed in Table 1, provided below.

|  | 2-input AND (TH22) | 2-input OR (TH12) |
|---|---|---|
| Boolean Eq. | A * B | A + B |
| Step 1 (F1, PDN) | A1 * B | A1 + A0 * B |
| Step 2 | $\overline{A1} + \overline{B}$ | A1 * $(\overline{A0 * B})$ |
| Step 3 (F0, PDN) | A0 + $\overline{B}$ | A0 * (A1 + $\overline{B}$) |

Table 1 above shows the evolving Boolean equations representative of pull-down networks (PDNs) and pull-up networks (PUNs) of CMOS designs described above. In embodiments, the A signal may be an asynchronous input and the B signal is a synchronous input. It is noted that a key design feature of the CMOS designs is that the gates included within the CMOS designs should only perform an execution operation when a value on A has been set. As part of step, 1 a minterm in the Boolean equation may be changed from A to A1, which will serve as the logic high wire in the datapath gate. Thereafter, steps 2 and 3 provide the Boolean equivalent of the PDN for the FO output. In embodiments, to implement an inverted input, the input would first have to be parsed through a NOT gate before arriving at the datapath gate, by adding another level of gate delay. To address and overcome this problem, every inverted synchronous input signal in the PDN path of a datapath gate will be routed to a pMOS gate instead of the normal nMOS gate. Thereafter, to design PUNs for a datapath gate, all asynchronous inputs may be connected to a sequence of series p-channel metal-oxide semiconductor (pMOS) gates.

This ensures that only asynchronous input signals are set and rest with the outputs of the datapath signals. Additionally, an important step for designing datapath gates includes determining appropriate sizes of each transistor. In embodiments, transistor sizes were designed such that the widths of these transistors were modified, while all of the lengths were kept uniform. Additionally, as illustrated in CMOS Designs 1100 and 1102, reverse oriented inverter G2 was designed to have a minimal size for all datapath gates and the forward oriented inverter G1 was designed to have dimensions that are double that of the minimally sized inverter. Such a design was uniformly applied for every datapath gate design. The PDNs for every design were sized according to the longest existing path in a particular design from GND to the input of the forward oriented inverter. It is also noted that as all PUNs were identically designed, the pMOS transistors were designed to have a size according to a path of two transistors in a similar to the method utilized for designing the PDN.

Figure 12A:
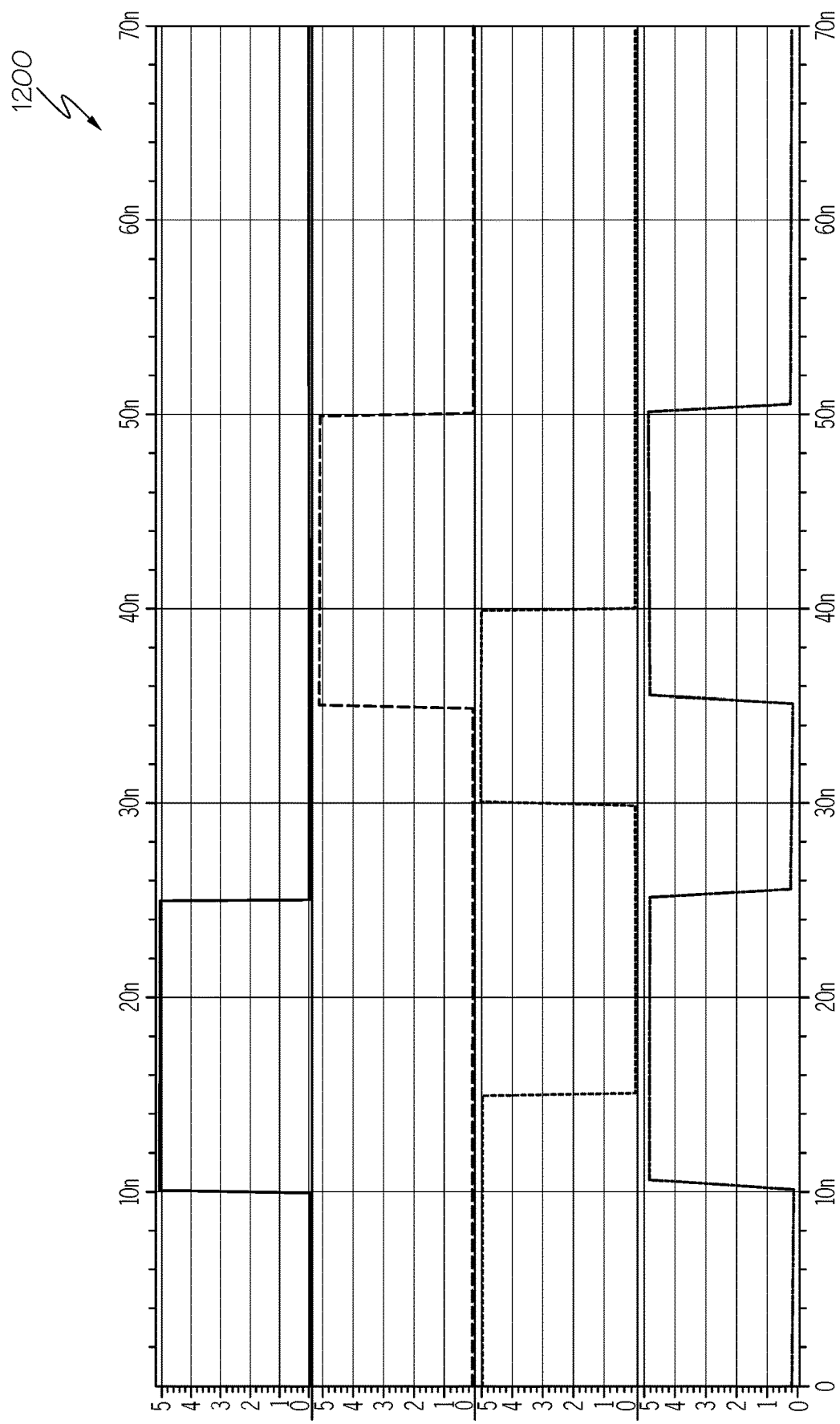
FIGS. 12A and 12B depict respective waveform simulation results for datapath equivalents of a 2-input "AND" and 2-input "OR" gate designs, according to one or more embodiments described and illustrated herein.
Figure 12B:
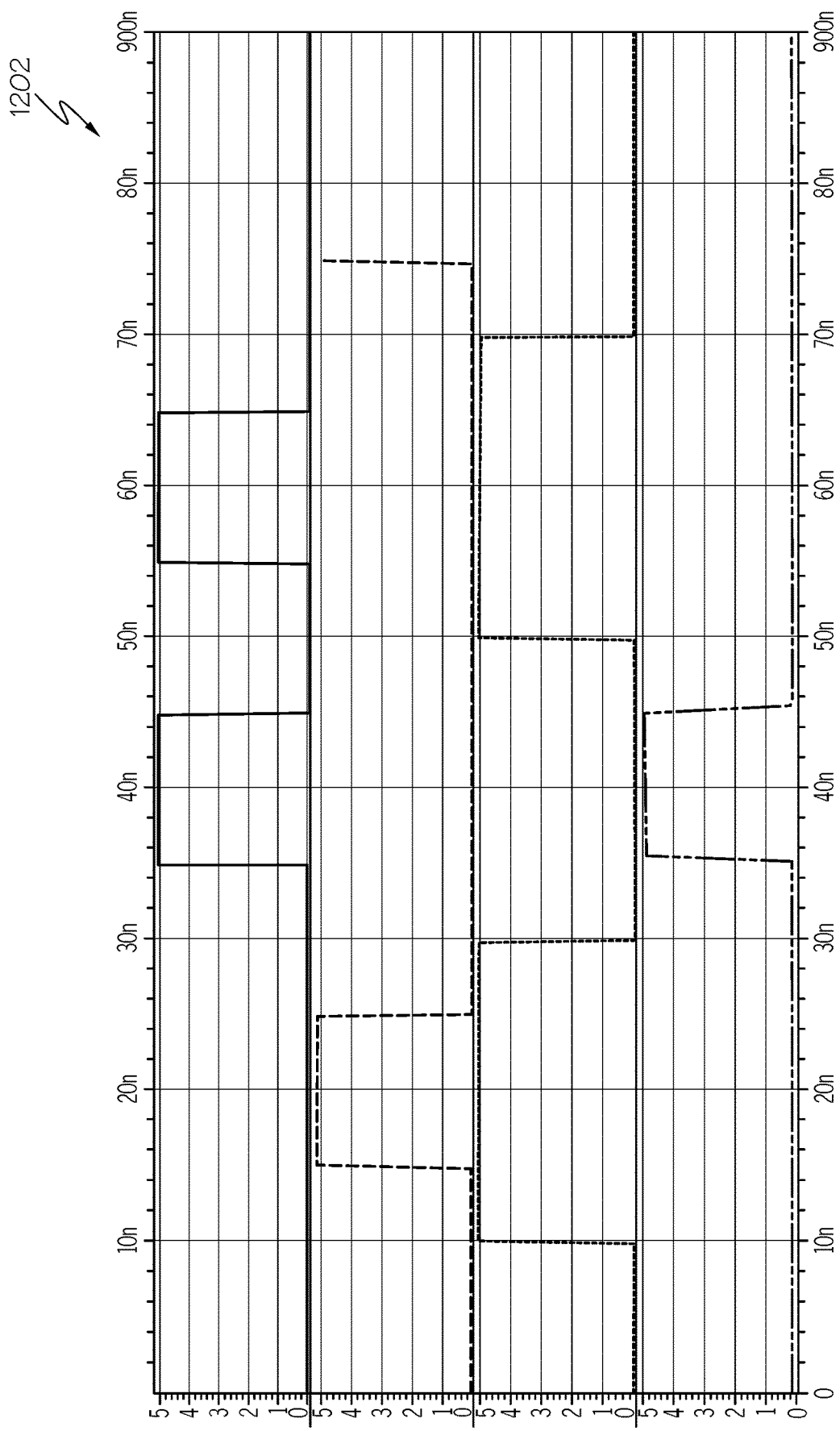

FIGS. 12A and 12B depict respective waveform simulation results 1200 and 1202 for datapath equivalents of a 2-input "AND" and 2-input "OR" gate designs, according to one or more embodiments described and illustrated herein. In short, these simulation results show the key result that outputs are never set during a "NULL" wave and both outputs, logic high and logic low, are never simultaneously set to have a value of high. Such a key result enables operation of and preserves the functionality of the circuit while keeping the RTZ characteristic of asynchronous circuits.

ASPECTS LISTING

Aspect 1. A system for null convention logic based applications having large bit-widths, the system comprises a two-transistor level delay based circuit including an nMOS active resistor and a plurality of nMOS transistors and a pMOS active resistor and a plurality of pMOS transistors, at least a subset of the plurality of nMOS transistors are coupled according to a parallel OR configuration and at least a subset of the plurality of pMOS transistors are coupled according to the parallel OR configuration, a source terminal of the nMOS active resistor is coupled to respective drain terminals of the plurality of nMOS transistors, and a source terminal of the pMOS active resistor is coupled to respective drain terminals of the plurality of pMOS transistors, a write sub-circuit component includes at least one of the plurality of nMOS transistors coupled to at least one of the plurality of pMOS transistors, wherein the write sub-circuit is controlled by reverse logic signals, and a gate component includes an additional subset of the plurality of nMOS transistors coupled to an additional subset of the plurality of pMOS transistors, the gate component corresponding to a semi-static cross-coupled inverter circuit.

Aspect 2. The system of Aspect 1, wherein the two-transistor level delay based circuit is a Mueller C-element based electromagnetic compatibility circuit.

Aspect 3. The system of Aspect 1 or Aspect 2, wherein the write sub-circuit is based on a modified t-gate.

Aspect 4. The system of any of Aspects 1 to 3, wherein the source terminal of the nMOS active resistor being coupled to the respective drain terminals of the plurality of nMOS transistors, and the source terminal of the pMOS active resistor being coupled to the respective drain terminals of the plurality of pMOS transistors prevents a path from a drain voltages of the two-transistor level delay based circuit to source voltages of the two-transistor level delay based circuit when inputs associated with two-transistor level delay based circuit are associated with a value that is equal to zero of when the inputs associated with the two-transistor level delay based circuit are associated with a different value of one.

Aspect 5. The system of any of Aspects 1 to 4, wherein the gate component further includes an additional nMOS transistor from the plurality of nMOS transistors connected to the additional subset of the plurality of nMOS transistors that are coupled to the additional subset of the plurality of pMOS transistors.

Aspect 6. The system of Aspect 5, the gate component further including the additional nMOS transistor corresponds to a sense-amplifier circuit.

Aspect 7. The system of Aspect 6, wherein the sense-amplifier circuit performs digital hysteresis.

Aspect 8. The system of Aspect 7, wherein the performing of the digital hysteresis enables the maintaining of an output value of the two-transistor level delay until a plurality of inputs are reset from a first value to a second value.

Aspect 9. The system of Aspect 8, wherein the first value corresponds to one and the second value corresponds to zero.

Aspect 10. The system of Aspect 10, wherein the two-transistor level delay based circuit has a fixed delay value that is independent of an input bit-width.

Aspect 11. The system of Aspect 7, wherein the sense-amplifier circuit reduces a load of the write sub-circuit component.

Aspect 12. A system for null convention logic based applications with high input bit-widths, the system comprises a two-transistor level delay based circuit including an nMOS active resistor and a plurality of nMOS transistors and a pMOS active resistor and a plurality of pMOS transistors, the two-transistor level delay based circuit has a fixed delay value that is independent of an input bit-width, wherein at least a subset of the plurality of nMOS transistors are coupled according to a parallel OR configuration and at least a subset of the plurality of pMOS transistors are coupled according to the parallel OR configuration, a source terminal of the nMOS active resistor is coupled to respective drain terminals of the plurality of nMOS transistors, and a source terminal of the pMOS active resistor is coupled to respective drain terminals of the plurality of pMOS transistors, a write sub-circuit component includes at least one of the plurality of nMOS transistors coupled to at least one of the plurality of pMOS transistors, wherein the write sub-circuit is controlled by reverse logic signals, and a gate component includes an additional subset of the plurality of nMOS transistors coupled to an additional subset of the plurality of pMOS transistors, the gate component corresponding to a semi-static cross-coupled inverter circuit.

Aspect 13. The system of Aspect 12, wherein the two-transistor level delay based circuit is a Mueller C-element based electromagnetic compatibility circuit.

Aspect 14. The system of Aspect 12, wherein the write sub-circuit is based on a modified t-gate.

Aspect 15. The system of Aspect 12, wherein the source terminal of the nMOS active resistor being coupled to the respective drain terminals of the plurality of nMOS transistors, and the source terminal of the pMOS active resistor being coupled to the respective drain terminals of the plurality of pMOS transistors prevents a path from a drain voltages of the two-transistor level delay based circuit to source voltages of the two-transistor level delay based circuit when inputs associated with two-transistor level delay based circuit are associated with a value that is equal to zero of when the inputs associated with the two-transistor level delay based circuit are associated with a different value of one.

Aspect 16. The system of Aspect 12, wherein the gate component further includes an additional nMOS transistor from the plurality of nMOS transistors connected to the additional subset of the plurality of nMOS transistors that are coupled to the additional subset of the plurality of pMOS transistors.

Aspect 17. The system of Aspect 16, wherein the gate component further including the additional nMOS transistor corresponds to a sense-amplifier circuit.

Aspect 18. The system of Aspect 17, wherein the sense-amplifier circuit performs digital hysteresis.

Aspect 19. The system of Aspect 18, wherein the performing of the digital hysteresis enables the maintaining of an output value of the two-transistor level delay based circuit until a plurality of inputs are reset from a first value to a second value.

Aspect 20. The system of Aspect 17, wherein the sense-amplifier circuit reduces a load of the write sub-circuit component.

The terminology used herein is for the purpose of describing particular aspects only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. The term "or a combination thereof" means a combination including at least one of the foregoing elements.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

The invention claimed is:

1. A system for null convention logic based applications having high input bit-widths, the system comprising:
   a two-transistor level delay based circuit including an nMOS active resistor and a plurality of nMOS transistors and a pMOS active resistor and a plurality of pMOS transistors,
      at least a subset of the plurality of nMOS transistors coupled according to a parallel OR configuration configured to generate a first reverse logic signal and at least a subset of the plurality of pMOS transistors are coupled according to the parallel OR configuration configured to generate a second reverse logic signal,
      a source terminal of the nMOS active resistor coupled to respective drain terminals of the plurality of nMOS transistors, a source terminal of the pMOS active resistor coupled to respective drain terminals of the plurality of pMOS transistors, a gate terminal of the pMOS active resistor and a gate terminal of the nMOS active resistor shorted to connect to an inverted output, and wherein the nMOS active resistor and the pMOS active resistor are coupled to each other in a parallel configuration;

a write sub-circuit component includes at least one of the plurality of nMOS transistors coupled to at least one of the plurality of pMOS transistors, wherein;

a gate terminal of the at least one of the plurality of nMOS transistors is configured to receive the first reverse logic signal, a gate terminal of the at least one of the plurality of pMOS transistors is configured to receive the second reverse logic signal, and the write sub-circuit component configured to generate an output; and a gate component includes an additional subset of the plurality of nMOS transistors coupled to an additional subset of the plurality of pMOS transistors, the gate component corresponding to a semi-static cross-coupled inverter circuit, the gate component configured to receive the output and generate the inverted output.

2. The system of claim 1, wherein the two-transistor level delay based circuit is a Mueller C-element based electromagnetic compatibility circuit.

3. The system of claim 1, wherein the write sub-circuit is based on a modified t-gate.

4. The system of claim 1, wherein the source terminal of the nMOS active resistor being coupled to the respective drain terminals of the plurality of nMOS transistors, and the source terminal of the pMOS active resistor being coupled to the respective drain terminals of the plurality of pMOS transistors prevents a path from a drain voltages of the two-transistor level delay based circuit to source voltages of the two-transistor level delay based circuit when inputs associated with the two-transistor level delay based circuit are associated with a value that is equal to zero of when the inputs associated with the two-transistor level delay based circuit are associated with a different value of one.

5. The system of claim 1, wherein the gate component further includes an additional nMOS transistor from the plurality of nMOS transistors connected to the additional subset of the plurality of nMOS transistors that are coupled to the additional subset of the plurality of pMOS transistors.

6. The system of claim 5, wherein the gate component further including the additional nMOS transistor corresponds to a sense-amplifier circuit.

7. The system of claim 6, wherein the sense-amplifier circuit performs digital hysteresis.

8. The system of claim 7, wherein the performing of the digital hysteresis enables the maintaining of an output value of the two-transistor level delay based circuit until a plurality of inputs are reset from a first value to a second value.

9. The system of claim 8, wherein the first value corresponds to one and the second value corresponds to zero.

10. The system of claim 1, wherein the two-transistor level delay based circuit has a fixed delay value that is independent of an input bit-width.

11. The system of claim 7, wherein the sense-amplifier circuit reduces a load of the write sub-circuit component.

12. A system for null convention logic based applications with high input bit-widths, the system comprising:

a two-transistor level delay based circuit including an nMOS active resistor and a plurality of nMOS transistors and a pMOS active resistor and a plurality of pMOS transistors, the two-transistor level delay based circuit has a fixed delay value that is independent of an input bit-width, wherein at least a subset of the plurality of nMOS transistors are coupled according to a parallel OR configuration configured to generate a first reverse logic signal and at least a subset of the plurality of pMOS transistors are coupled according to the parallel OR configuration configured to generate a second reverse logic signal, a source terminal of the nMOS active resistor is coupled to respective drain terminals of the plurality of nMOS transistors, a source terminal of the pMOS active resistor is coupled to respective drain terminals of the plurality of pMOS transistors, a gate terminal of the pMOS active resistor and a gate terminal of the nMOS active resistor shorted to connect to an inverted output, and wherein the nMOS active resistor and the pMOS active resistor are coupled to each other in a parallel configuration;

a write sub-circuit component includes at least one of the plurality of nMOS transistors coupled to at least one of the plurality of pMOS transistors, wherein:

a gate terminal of the at least one of the plurality of nMOS transistors is configured to receive the first reverse logic signal, a gate terminal of the at least one of the plurality of pMOS transistors is configured to receive the second reverse logic signal, and the write sub-circuit component configured to generate an output; and a gate component includes an additional subset of the plurality of nMOS transistors coupled to an additional subset of the plurality of pMOS transistors, the gate component corresponding to a semi-static cross-coupled inverter circuit, the gate component configured to receive the output and generate the inverted output.

13. The system of claim 12, wherein the two-transistor level delay based circuit is a Mueller C-element based electromagnetic compatibility circuit.

14. The system of claim 12, wherein the write sub-circuit is based on a modified t-gate.

15. The system of claim 12, wherein the source terminal of the nMOS active resistor being coupled to the respective drain terminals of the plurality of nMOS transistors, and the source terminal of the pMOS active resistor being coupled to the respective drain terminals of the plurality of pMOS transistors prevents a path from a drain voltages of the two-transistor level delay based circuit to source voltages of the two-transistor level delay based circuit when inputs associated with the two-transistor level delay based circuit are associated with a value that is equal to zero of when the inputs associated with the two-transistor level delay based circuit are associated with a different value of one.

16. The system of claim 12, wherein the gate component further includes an additional nMOS transistor from the plurality of nMOS transistors connected to the additional subset of the plurality of nMOS transistors that are coupled to the additional subset of the plurality of pMOS transistors.

17. The system of claim 16, wherein the gate component further including the additional nMOS transistor corresponds to a sense-amplifier circuit.

18. The system of claim 17, wherein the sense-amplifier circuit performs digital hysteresis.

19. The system of claim 18, wherein the performing of the digital hysteresis enables the maintaining of an output value of the two-transistor level delay based circuit until a plurality of inputs are reset from a first value to a second value.

20. The system of claim 17, wherein the sense-amplifier circuit reduces a load of the write sub-circuit component.

\* \* \* \* \*